United States Patent
Olligs et al.

(10) Patent No.: US 7,589,019 B2
(45) Date of Patent: Sep. 15, 2009

(54) MEMORY CELL ARRAY AND METHOD OF FORMING A MEMORY CELL ARRAY

(75) Inventors: Dominik Olligs, Dresden (DE); Veronika Polei, Dresden (DE)

(73) Assignee: Infineon Technologies, AG, Neubiberg (DE)

( * ) Notice: Subject to any disclaimer, the term of this patent is extended or adjusted under 35 U.S.C. 154(b) by 440 days.

(21) Appl. No.: 11/443,432

(22) Filed: May 31, 2006

(65) Prior Publication Data

US 2007/0278546 A1    Dec. 6, 2007

(51) Int. Cl.
*H01L 21/44* (2006.01)
*H01L 29/40* (2006.01)

(52) U.S. Cl. ........................ 438/668; 257/775
(58) Field of Classification Search ................ 365/205; 257/649, 390, 773–781; 438/666–675
See application file for complete search history.

(56) References Cited

U.S. PATENT DOCUMENTS

| | | | |
|---|---|---|---|
| 5,396,451 A * | 3/1995 | Ema | 365/51 |
| 5,802,000 A * | 9/1998 | Hamada | 365/205 |
| 6,346,733 B1 | 2/2002 | Lee et al. | |
| 6,381,166 B1 * | 4/2002 | Yoshida et al. | 365/63 |
| 6,898,102 B2 * | 5/2005 | Keeth | 365/63 |
| 2002/0024118 A1 * | 2/2002 | Okoshi et al. | 257/649 |
| 2005/0199913 A1 | 9/2005 | Hofmann et al. | |

* cited by examiner

*Primary Examiner*—Calvin Lee
(74) *Attorney, Agent, or Firm*—Edell, Shapiro & Finnan, LLC

(57) ABSTRACT

A memory cell array includes a plurality of first conductive lines running in a first direction, where the first conductive lines have a pitch Bp, a plurality of second conductive lines, and a plurality of memory cells. Each of the memory cells are at least partially formed in a semiconductor substrate and are accessible by addressing at least a corresponding one of the first conductive lines and at least a corresponding one of the second conductive lines. The memory cell array further includes a plurality of supporting lines, where the supporting lines have a pitch Mp and are disposed above the first and second conductive lines, and a plurality of supporting contacts. The first conductive lines are connected with corresponding ones of the supporting lines via the supporting contacts, and Mp is larger than Bp.

30 Claims, 12 Drawing Sheets

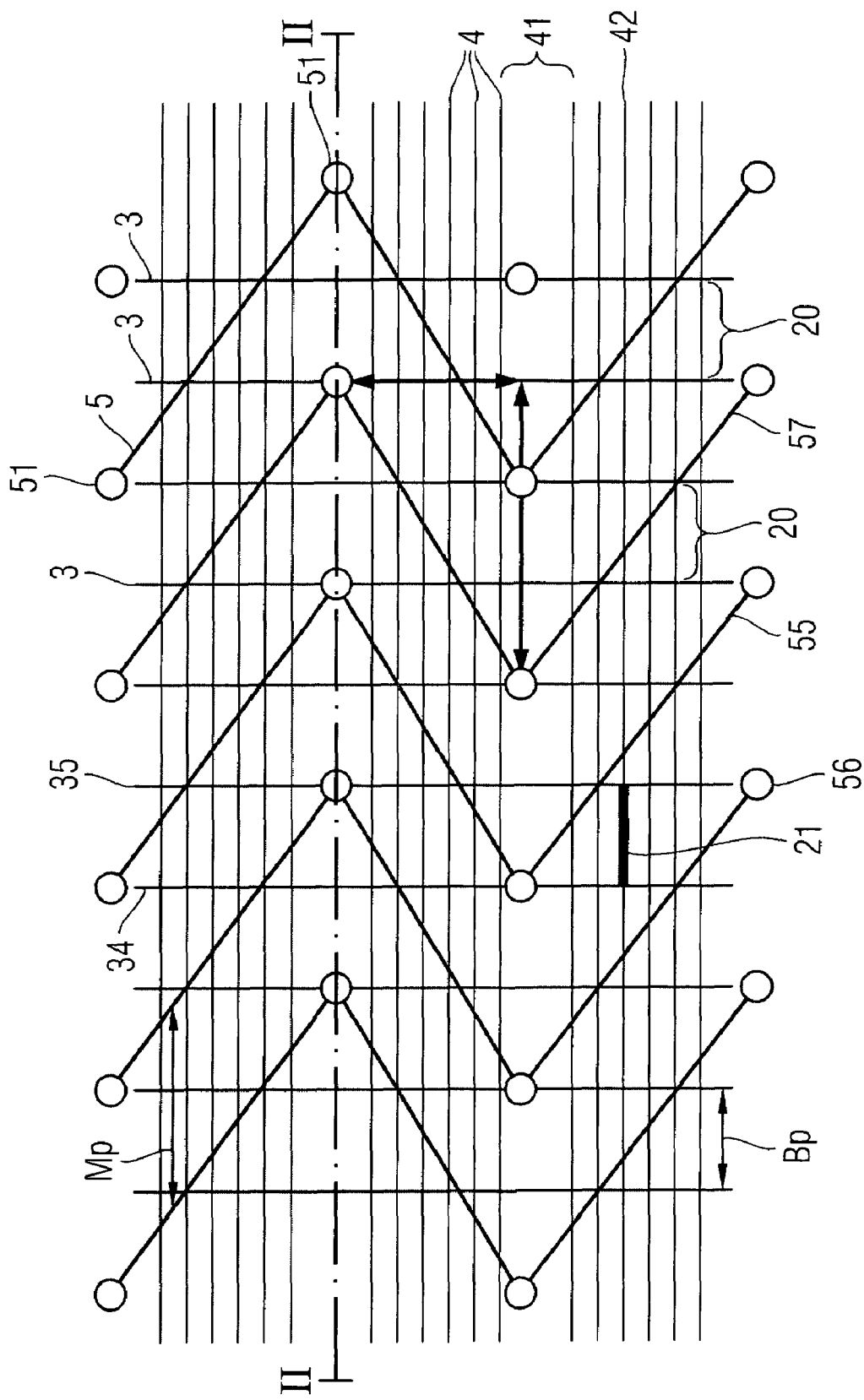

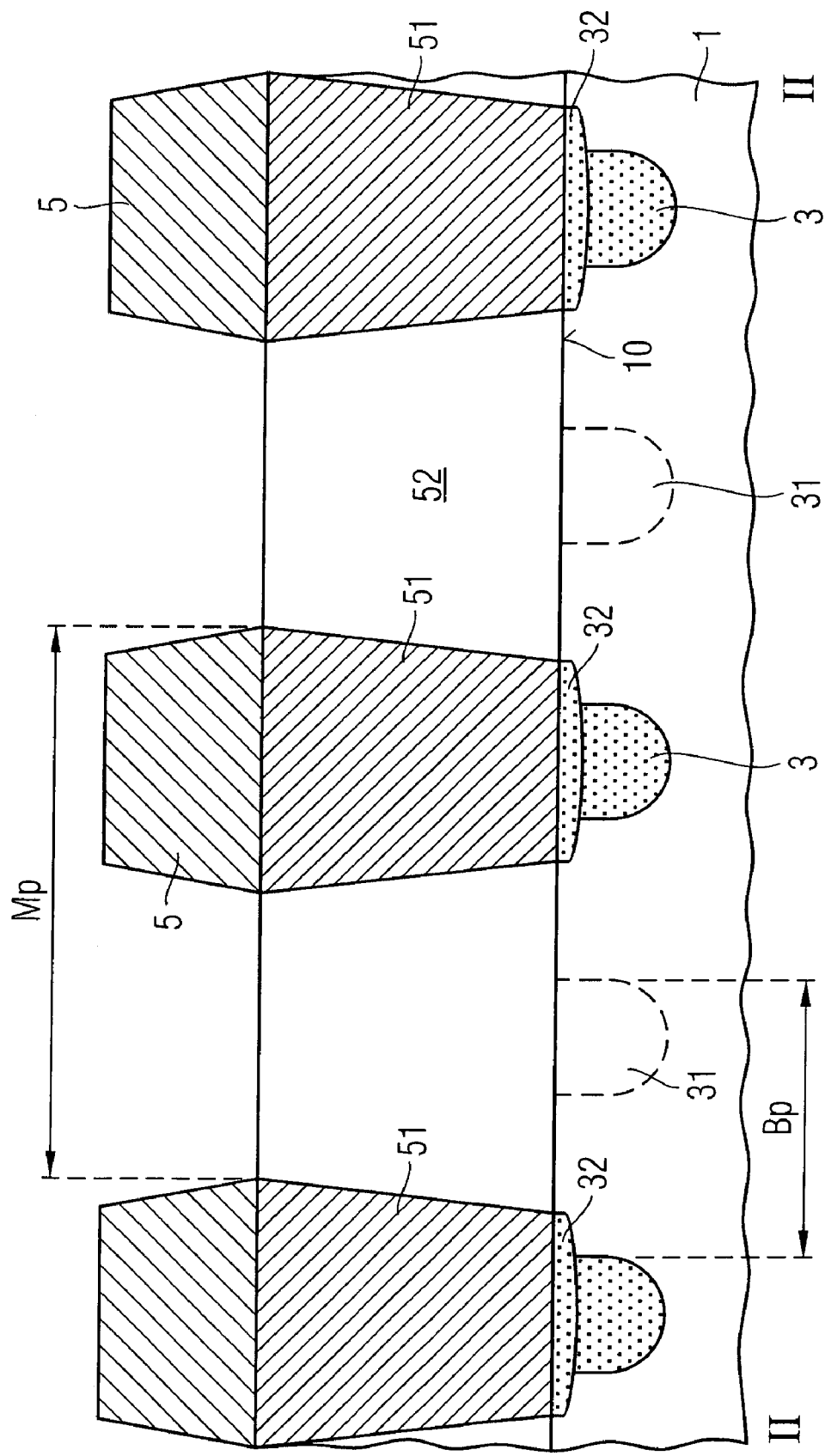

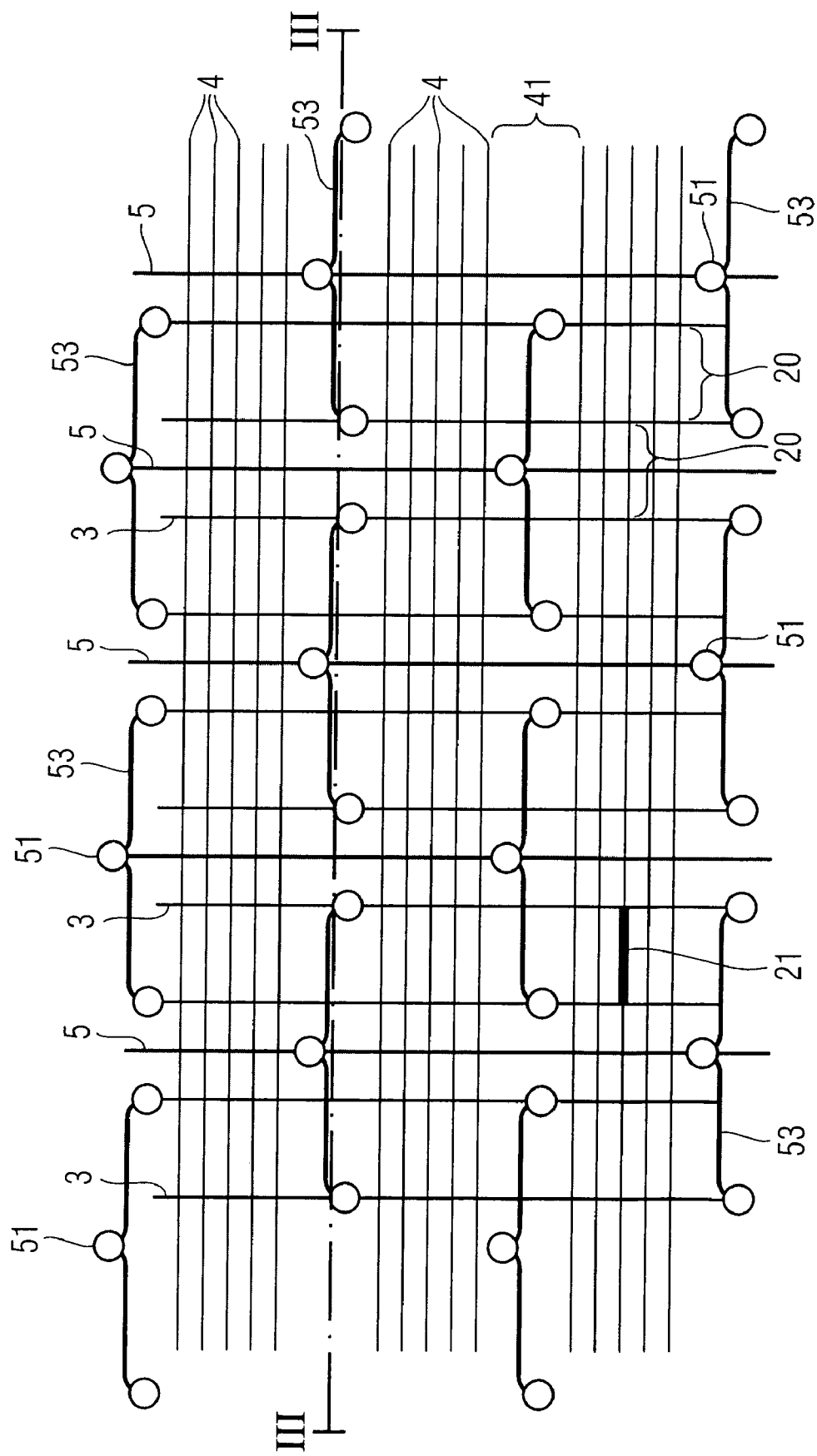

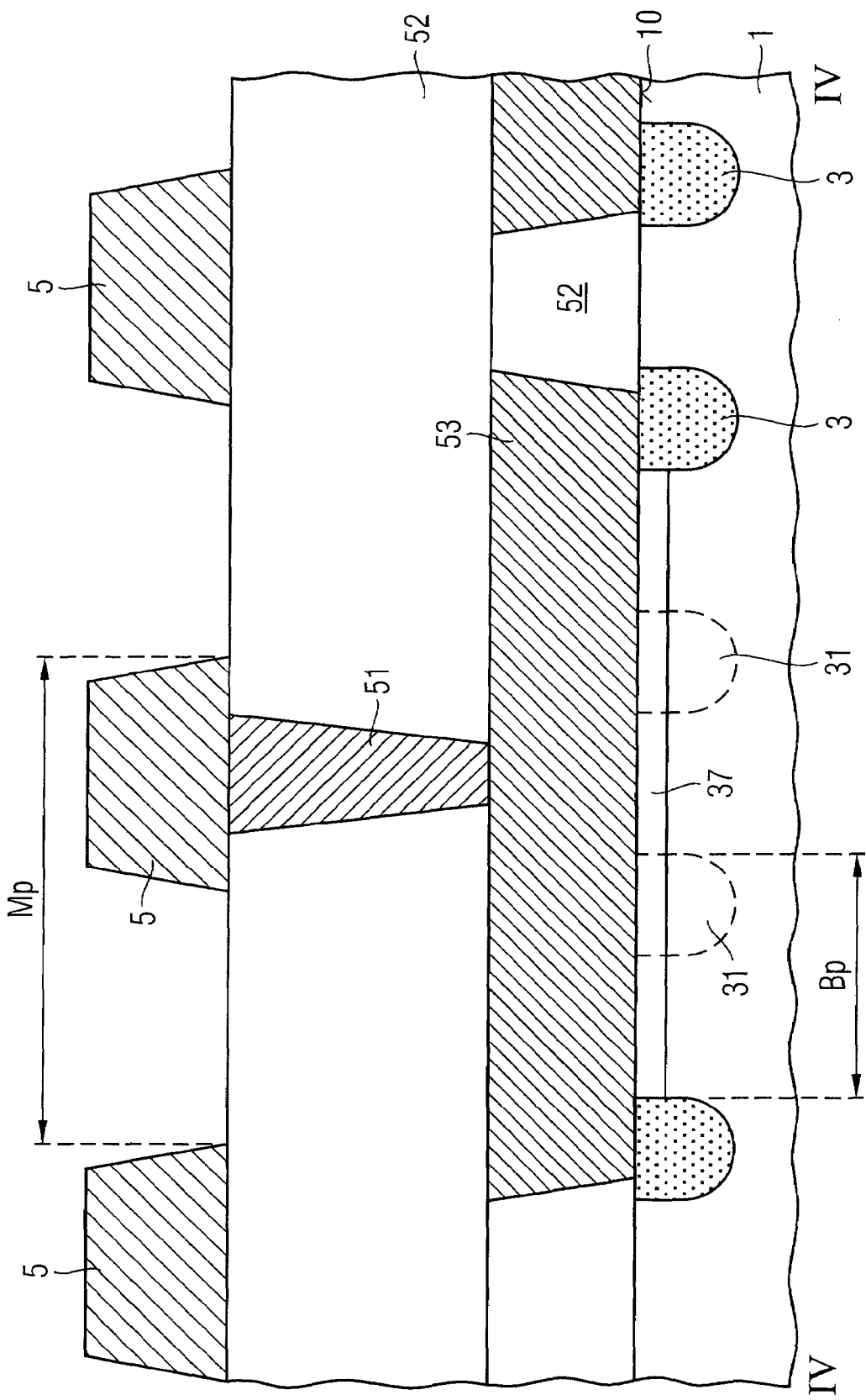

MEMORY CELL ARRAY AND METHOD OF FORMING A MEMORY CELL ARRAY

FIELD OF THE INVENTION

The present invention relates to a semiconductor memory cell array including a plurality of memory cells and a method of forming a memory cell array.

BACKGROUND

A semiconductor memory cell array typically includes a plurality of memory cells that are arranged in rows and columns. Moreover, such a memory cell array includes a plurality of bitlines and a plurality of wordlines. For example, the gate electrodes of rows of memory cell transistors are connected by wordlines, by which the memory cells are to be addressed.

An example of a non-volatile memory device is based on NROM technology. For example, a cross-sectional view is shown in FIG. 3 of an NROM cell between V and V as is shown in FIG. 1. In particular, the NROM cell is an n-channel MOSFET device, wherein the gate dielectric is replaced with a storage layer stack 27. As is shown in FIG. 3, the storage layer stack 27 is disposed above the channel 25 and under the gate electrode 26. The storage layer stack 27 includes a silicon nitride layer 272 which stores the charge and two insulating silicon dioxide layers 271, 273 which sandwich the silicon nitride layer 272. The silicon dioxide layers 271, 273 have a thickness larger than 2 nm to avoid any direct tunnelling. In the NROM cell shown in FIG. 3, two charges 221, 222 are stored at each of the edges adjacent to the n-doped source/drain regions 23, 24.

In a memory cell array with a plurality of memory cells of the manner shown in FIG. 3, the bitlines are implemented as doped portions 23, 24 and thus form buried bitlines 3. In other words, segments of the bitlines form the first and second source/drain regions 23, 24 of a corresponding memory cell. Moreover, segments of the wordlines form the gate electrode 26 of a corresponding memory cell. The NROM cell is programmed by channel hot electron injection (CHE), for example, whereas erasing is accomplished by hot hole enhanced tunnelling (HHET) by applying appropriate voltages to the corresponding bitlines and wordlines, respectively. Due to the charge trapped in the charge storage layer, the threshold voltage of the transistor is changed. By applying appropriate voltages to the corresponding wordlines and bitlines the changed threshold voltage and, thus, the stored information is detected.

Since, as has been described above, the bitlines are implemented as n-doped substrate portions, the problem arises that the resistance of the bitlines is comparatively high. Accordingly, usually metal bitlines (not shown in FIG. 3) are provided, the metal bitlines being arranged in a higher metallization layer above the semiconductor substrate 1 and gate electrodes 26. Each single bitline is connected with the supporting metal bitline at predetermined intervals by a bitline contact.

FIG. 1 shows a plan view of a memory cell array including a plurality of NROM cells as have been described with reference to FIG. 3. As can be seen, a plurality of wordlines 4 are provided. Moreover, a plurality of metal bitlines 5 are provided on top of the wordlines 4. The metal bitlines 5 are disposed directly above the buried bitlines (not shown in this drawing) which have been described above. FIG. 1 also shows a wordline removal portion 41 in which selected wordlines are removed. In the wordline removal portion 41, bitline contacts between the supporting bitlines 5 and the buried bitlines are provided. At a point of intersection between the wordlines 4 and the bitlines, memory cells 20 are provided. FIG. 1 shows a selected memory cell 21. For addressing the selected memory cell 21, it is necessary to address the two adjacent supporting bitlines 55, 56 as well as the corresponding wordline 42. As can be seen in FIG. 1, the supporting bitlines 5 are disposed directly above the buried bitlines and, consequently, have the same pitch.

FIG. 2 shows a cross-sectional view of a memory cell array, which is taken between I and I as can be taken from FIG. 1. As can be seen, buried bitlines 3 which are made of n-doped substrate portions are disposed adjacent to the surface 10 of a semiconductor substrate 1. In the wordline removal region 41 a plurality of bitline contacts 51 are provided. The bitline contacts 51 are made of a conductive material. Adjacent bitline contacts 51 are insulated from each other by the dielectric material 52. On top of the dielectric material 52 a plurality of supporting bitlines 5 are provided. The distance between neighbouring supporting bitlines 5 is denoted as Mp. Mp refers to the pitch of the array of supporting lines 5. In other words, Mp denotes the distance between the center of each of the supporting lines 5, respectively. Moreover, the buried bitlines 3 are arranged at a pitch Bp, wherein the pitch Bp can be measured from center to center of each of the buried bitlines or from the right or left edge to the right or left edge of each of the buried bitlines 3, respectively. As can be seen from FIG. 2, the pitch Bp of the buried bitlines 3 is equal to the pitch Mp of the supporting bitlines 5.

SUMMARY

According to the invention, a memory cell array comprises a semiconductor substrate including a surface, and a plurality of first conductive lines running in a first direction. The first conductive lines have a pitch Bp, the pitch being measured in a cross-sectional view taken along a second direction perpendicularly with respect to the surface of the substrate, where the pitch Bp is the distance between the center positions of two adjacent first conductive lines. The memory cell array further comprises a plurality of second conductive lines, a plurality of memory cells, each of the memory cells being at least partially formed in the semiconductor substrate and being accessible by addressing at least a corresponding one of the first conductive lines and at least a corresponding one of the second conductive lines, and a plurality of supporting lines. The supporting lines have a pitch Mp, the pitch being measured in a cross-sectional view taken along a second direction perpendicularly with respect to the surface of the substrate, where the pitch Mp is the distance between the center positions of two adjacent supporting lines, the supporting lines being disposed above the first and second conductive lines. The memory cell array further comprises a plurality of supporting contacts, where the first conductive lines are connected with corresponding ones of the supporting lines via the supporting contacts, and where Mp is larger than Bp.

In another embodiment of the invention, a method of forming a memory cell array comprises providing a semiconductor substrate including a surface, and providing a plurality of first conductive lines running in a first direction, where the first conductive lines have a pitch Bp that is measured in a cross-sectional view taken along a second direction perpendicularly with respect to the surface of the substrate, the pitch Bp being the distance between the center positions of two adjacent first conductive lines. The method further comprises providing a plurality of second conductive lines, providing a plurality of memory cells, each of the memory cells being at least partially formed in the semiconductor substrate, each of the memory cells being accessible by addressing at least a corresponding one of the first conductive lines and at least a corresponding one of the second conductive lines, providing a plurality of supporting lines above the first and second conductive lines, the supporting lines having a pitch Mp that is measured in a cross-sectional view taken along a second direction perpendicularly with respect to the surface of the substrate, where the pitch Mp is the distance between the center positions of two adjacent supporting lines, providing a plurality of supporting contacts, the first conductive lines being connected with corresponding ones of the supporting lines via the supporting contacts, and where Mp is larger than Bp.

In a further embodiment of the invention, a memory cell array comprises a semiconductor substrate including a surface, a plurality of first conductive lines running in a first direction, the first conductive lines having a pitch Bp that is measured in a cross-sectional view taken along a second direction perpendicularly with respect to the surface of the substrate, where the pitch Bp is the distance between the center positions of two adjacent first conductive lines, a plurality of second conductive lines, a plurality of memory cells, each of the memory cells being at least partially formed in the semiconductor substrate, each of the memory cells being accessible by addressing at least a corresponding one of the first conductive lines and at least a corresponding one of the second conductive lines, a plurality of supporting lines, the supporting lines having a pitch Mp that is measured in a cross-sectional view taken along a second direction perpendicularly with respect to the surface of the substrate, the pitch Mp being the distance between the center positions of two adjacent supporting lines, the supporting lines being disposed above the first and second conductive lines, and means for connecting the first conductive lines with corresponding ones of the supporting lines, where Mp is larger than Bp.

The above and still further objects, features and advantages of the present invention will become apparent upon consideration of the following detailed description of specific embodiments thereof, wherein like numerals define like components in the drawings.

BRIEF DESCRIPTION OF THE DRAWINGS

FIG. 4A shows an exemplary plan view of a memory cell array in accordance with the invention.

FIG. 6A shows a plan view of the memory cell array according to the embodiment shown in FIG. 4A.

FIG. 7 shows a plan view on a memory cell array according to a further embodiment of the invention.

FIG. 9B shows a cross-sectional view of the memory cell array shown in FIG. 9A.

DETAILED DESCRIPTION

Figure 1:
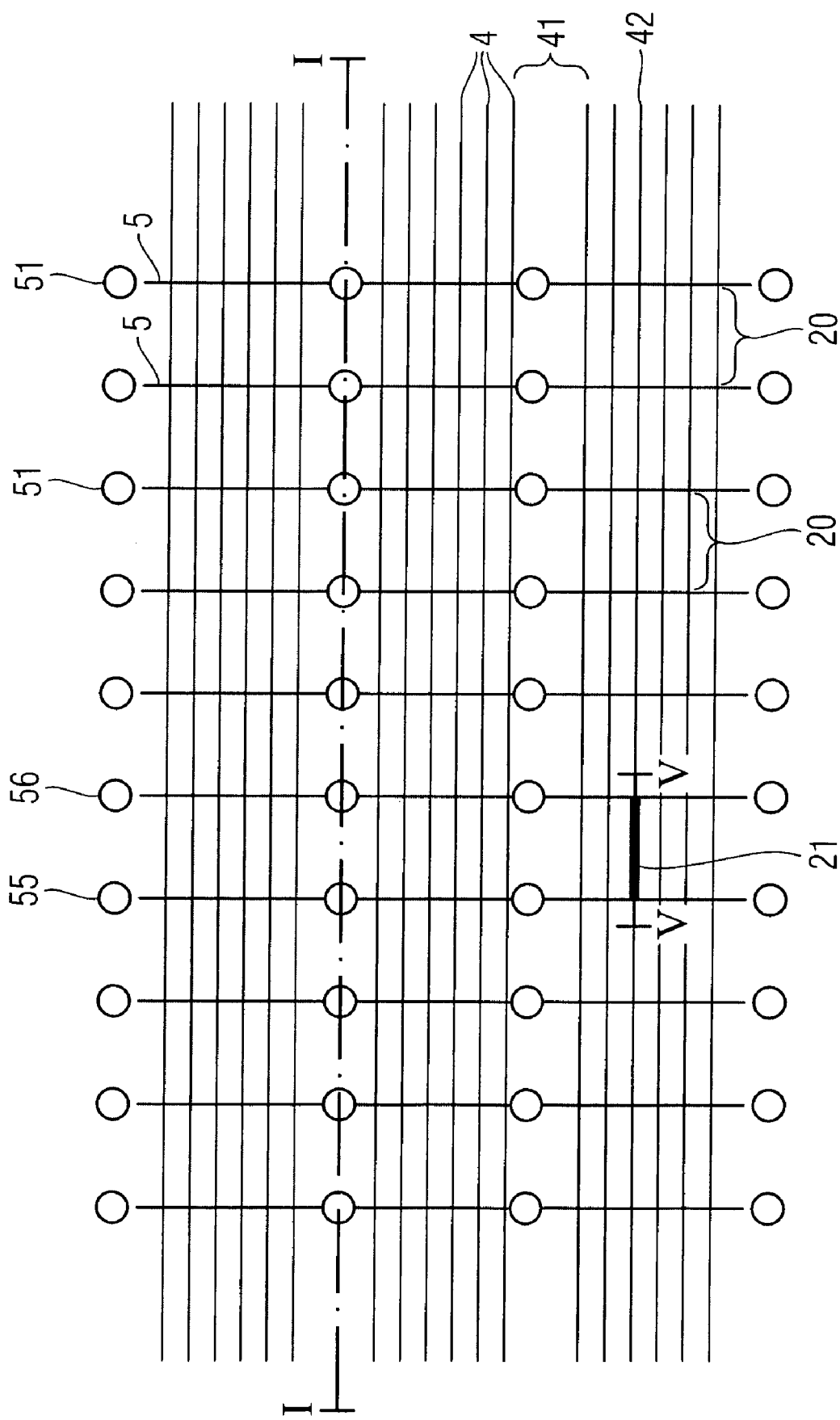
FIG. 1 shows a plan view of a conventional memory cell array.
Figure 2:
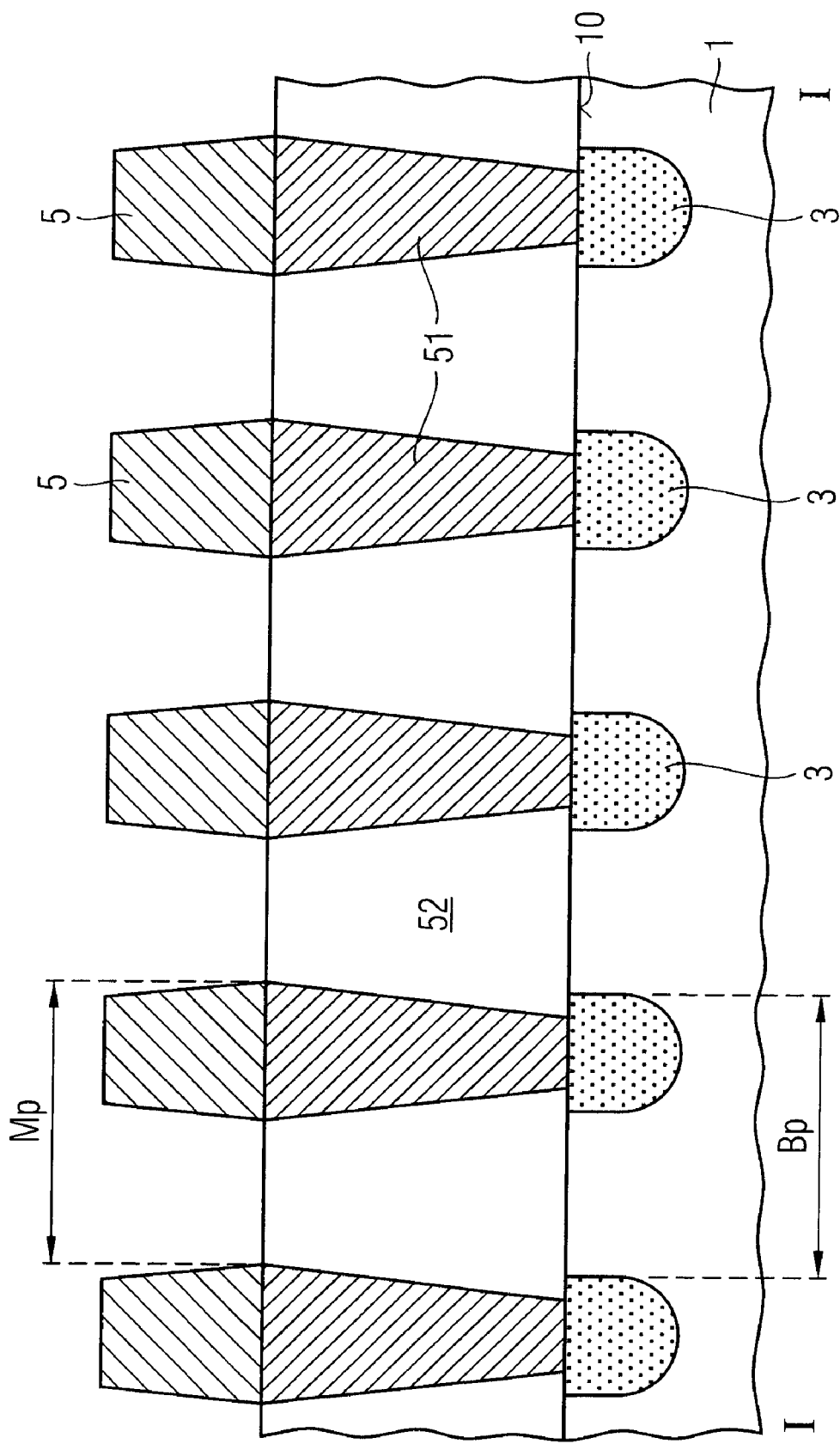
FIG. 2 shows a cross-sectional view of a conventional memory cell array.
Figure 3:
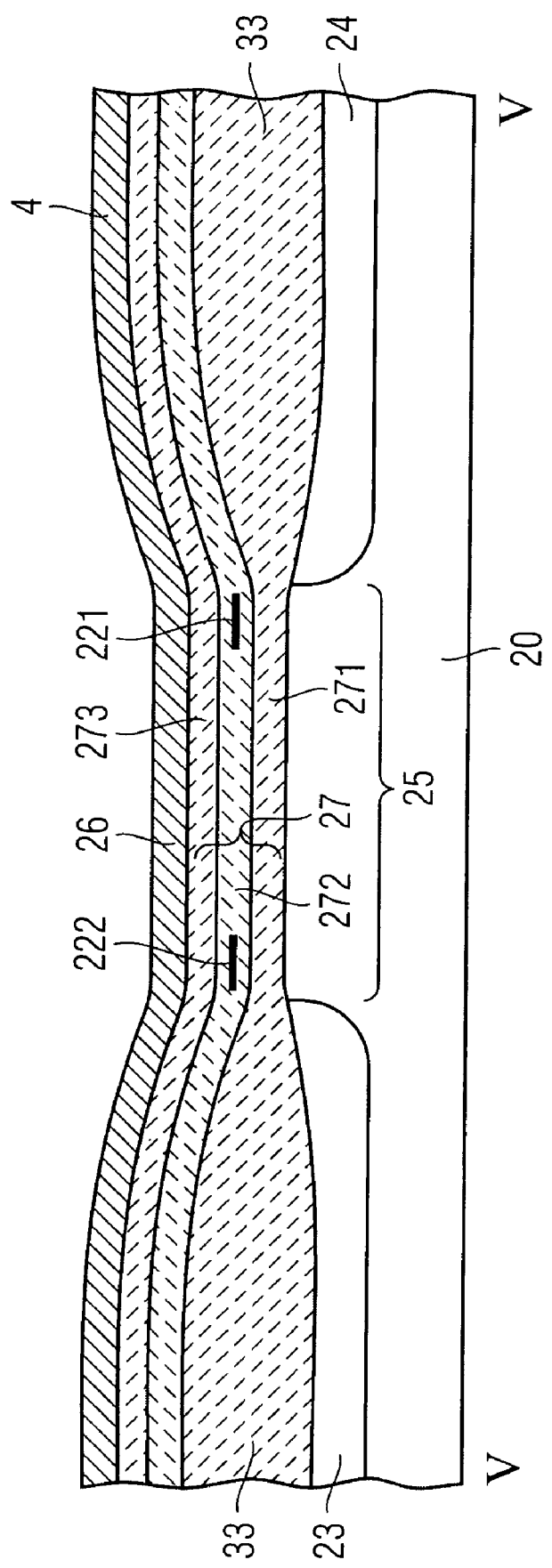
FIG. 3 shows a cross-sectional view of a conventional NROM memory cell.

In the following detailed description, reference is made to the accompanying drawings, which form a part hereof, and in which are illustrated by way of illustration specific embodiments in which the invention may be practiced. In this regard, directional terminology such as "top", "bottom", "front", "back", "leading", "trailing" etc., is used with reference to the orientation of the Figures being described. Because components of embodiments of the present invention can be positioned in a number of different orientations, the directional terminology is used for purposes of illustration and in no way be considered limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 4A shows a plan view of a memory cell array according to a first embodiment of the present invention. As can be seen, a plurality of buried bitlines 3 are arranged so as to extend in a first direction. Moreover, a plurality of wordlines 4 are arranged in a second direction which intersects the first direction. In particular, in FIG. 4A, the second direction is perpendicular to the first direction. Usually the wordlines are arranged at a pitch of approximately 2·F, wherein F denotes the minimal structural feature size which can be obtained by the technology employed. For example, F can be 150 nm, 120 nm, 100 nm, 95 nm, 85 nm, 65 nm, 55 nm, 45 nm or even less. Moreover, the buried bitlines 3 are arranged at a pitch of approximately 2.5 to 3·F. As is shown, every $7^{th}$ and $8^{th}$ wordline is removed so as to form the wordline removal portion 41. Memory cells 20 are formed at an intersection between the buried bitlines 3 and the wordlines 4. Moreover, above the wordlines 4 supporting bitlines 5 are arranged. As can be seen, the supporting bitlines 5 have a pitch which is much larger than the pitch Bp of the buried bitlines 3. In each of the wordline removal portions 41, bitline contacts 51 are provided so as to provide a contact between the buried bitline 3 and a corresponding supporting bitline 5. As has been described above, for addressing the selected memory cell 21, an appropriate voltage has to be applied to the selected buried bitlines 34 and 35 as well as to the wordline 4.

Accordingly, the interconnecting scheme for connecting the supporting bitlines 5 with corresponding buried bitlines 3 preferably is configured in such a manner, that the selected bitlines 34, 35 can be addressed by two separate supporting bitlines 55, 56. Accordingly, one supporting bitline is connected with the predetermined buried bitline and further buried bitlines, where at least two buried bitlines are disposed between the buried bitlines which are connected with one single supporting bitline 5. In other words, the selected bitlines 34, 35 and the further bitline 36 should be connected with the selected supporting bitlines 55, 56 and the further supporting bitline 57, respectively. Thus, the selected memory cell 21 is securely addressed by addressing the selected bitlines 55, 56 and the corresponding word line 42.

As is shown in FIG. 4A, this can be accomplished by providing supporting bitlines 5, each of the supporting bitlines including segments of lines extending in at least two different directions. Accordingly, a zigzag pattern can be formed by the supporting bitlines 5.

Figure 4B:
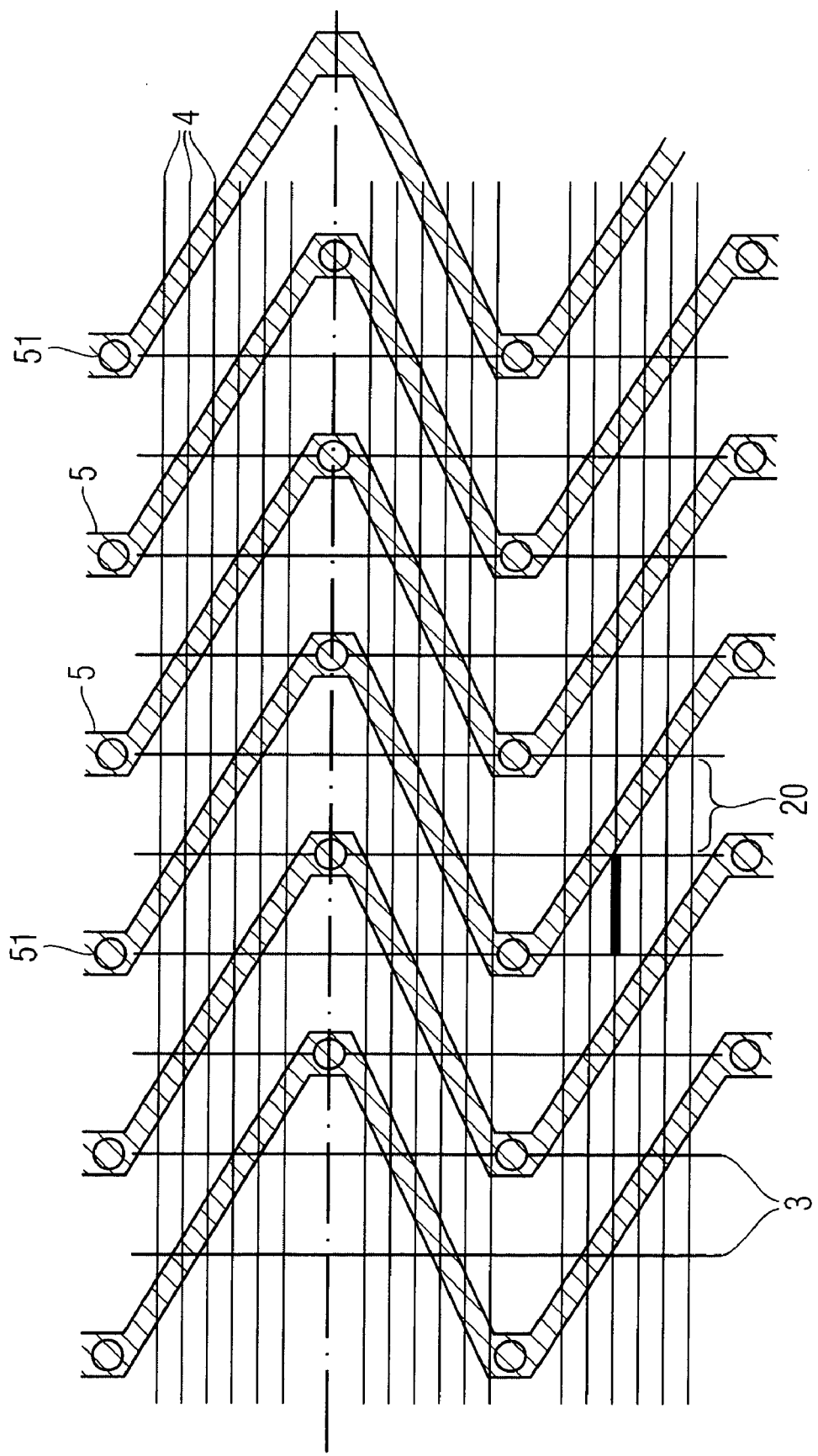
FIG. 4B shows an exemplary plan view of a memory cell array in accordance with the invention.

FIG. 4B shows a plan view of a further embodiment of the memory cell array according to the present invention. As can be seen, the supporting bitlines include segments running in the first direction in a portion in which the bitline contacts 51 are formed. Thus, a better contact resistance of the bitline contacts 51 is achieved.

Figure 5:
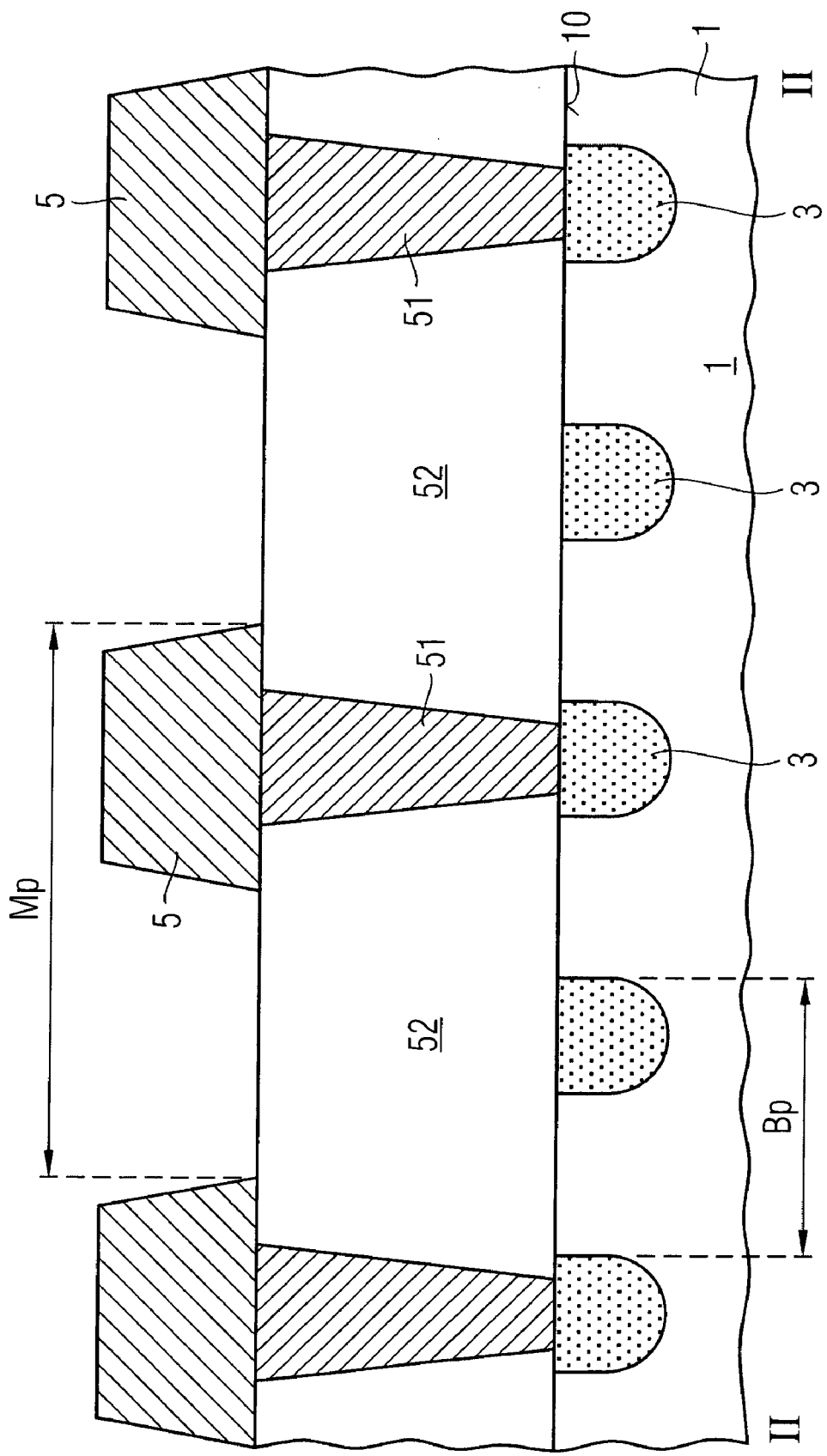
FIG. 5 shows a cross-sectional view of the memory cell array shown in FIG. 4A or 4B.

FIG. 5 shows a cross-sectional view which is taken between II and II as can be seen from FIG. 4A. In FIG. 5, a plurality of buried bitlines 3 are disposed adjacent to the surface 10 of a semiconductor substrate. In particular, the buried bitlines 3 can be implemented as $n^+$-doped portions whereas the semiconductor substrate 1 is, for example, a silicon substrate which may be p-doped. As can be seen, supporting lines 5 are disposed on the surface of the structure. The supporting lines may be made of a metal such as tungsten or aluminium. Optionally, a TiN liner may be provided beneath the supporting lines. The supporting lines 5 are disposed at a pitch Mp. In particular, Mp corresponds to the sum of the width and the distance between the supporting lines 5. The pitch Mp can be measured between the centers of each of the supporting lines 5 or can be the distance between each of the left hand edges or the right hand edges of each of the supporting lines 5, respectively. In the shown arrangement, the pitch between the supporting lines Mp is approximately equal to the double of the pitch Bp between the buried bitlines 3. As an example, the pitch Mp can be larger than 1.5×Bp or, for example, be equal or larger than 2×Bp. As can further be seen, each of the supporting lines 5 is disposed at the same height, the height being measured from the substrate surface 10. Nevertheless, the supporting lines 5 can as well be disposed at different heights.

Each of the supporting lines 5 is connected with a corresponding buried bitline 3. Accordingly, due to the enlarged pitch Mp, there are three supporting bitlines which are to be connected with three of five buried bitlines. Accordingly, the number of supporting bitlines is larger than the number of buried bitlines. Due to the enlarged pitch of the supporting bitlines, the patterning of the bitlines becomes easier. Moreover, due to their increased width, the resistance of the supporting bitlines is reduced. In addition, the distance between neighbouring supporting bitlines becomes larger whereby they do not contact or affect each other. Bitline contacts 51 are provided so as to connect the supporting bitlines as corresponding buried bitlines. The supporting contacts 51 can be made of a suitable conductive material such as tungsten. Adjacent bitline contacts 51 are insulated from each other by the dielectric material 52. In particular, the dielectric material 52 can be any insulating material such as silicon dioxide, silicon nitride, silicon oxynitride or BPSG (boron phosphorous silicate glass). Due to the reduced number of bitline contacts 51, the distance between adjacent bitline contacts 51 is increased, resulting in a reduced interference between neighbouring bitline contacts 51.

FIG. 6A shows a cross-sectional view of a memory cell array according to a further embodiment of the present invention. In the shown embodiment, the cross-sectional area of each of the bitline contacts 51 is enlarged, in order to reduce a contact resistance between the supporting lines 5 and the buried bitlines 3. In particular, a doped portion 32 is provided between each of the buried bitlines 3 and the supporting contacts 51. Due to the enlarged area of the supporting contact 51, it is desirable to provide the doped portions 32 so as to avoid a short circuit between the supporting contact 51 and the p-doped substrate portion 1. As is indicated by dotted lines, there is a bitline interruption portion 31 in which no bitline is formed. Leakage currents are thus avoided and the requirements with respect to the overlay are made less severe. As can further be seen, each of the supporting lines 5 is disposed at the same height, the height being measured from the substrate surface 10. Nevertheless, the supporting lines 5 can as well be disposed at different heights.

Figure 6B:
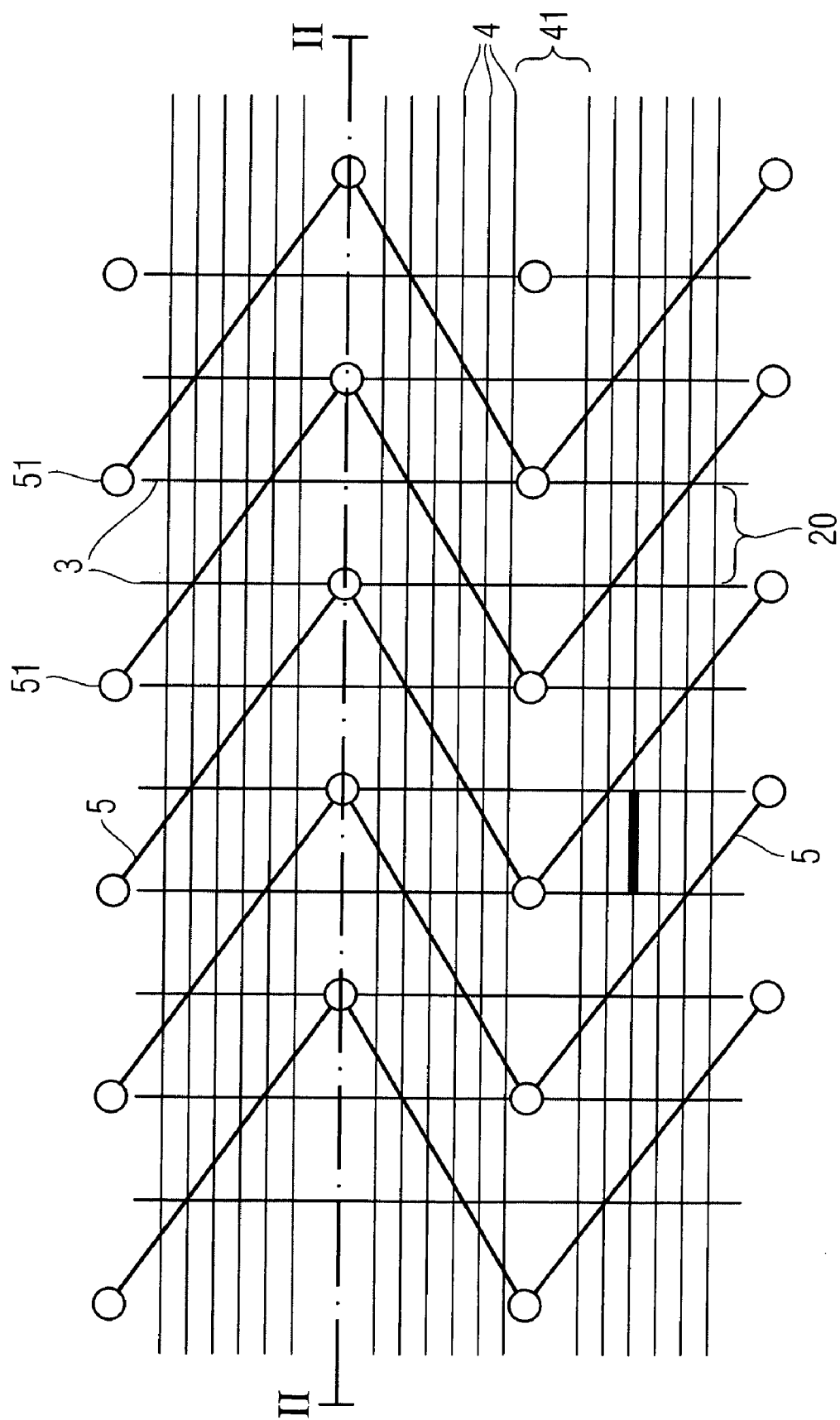
FIG. 6B shows a cross-sectional view of a memory cell array according to an embodiment of the present invention.

FIG. 6B shows a plan view of the memory cell array shown in FIG. 6A. As can be seen, the buried bitlines 3 are segmented so that interruption portions are formed in the word line removal portions 41.

FIG. 7 shows a plan view of a memory cell array according to a further embodiment of the present invention. As can be seen in FIG. 7, the supporting bitlines 5 are formed as straight lines. In addition, the supporting bitlines 5 extend in the same direction as the buried bitlines 3. In particular, as can be seen, the supporting bitlines 5 are disposed in every second space between adjacent buried bitlines 3. In addition, as can be seen from FIG. 7, the supporting bitline 5 is connected with two buried bitlines 3, where the two buried bitlines 3 are not directly adjacent to the supporting line 5. Accordingly, there are two other buried bitlines which are disposed between the two buried bitlines which are connected with one single supporting line 5. Moreover, as can be seen from FIG. 7, a plurality of buried bitlines 3 is arranged in a similar manner as is shown in FIG. 4. Moreover, wordlines 4 are arranged in a similar manner, memory cells 20 being disposed at a point of intersection between wordlines and corresponding buried bitlines.

Figure 8:
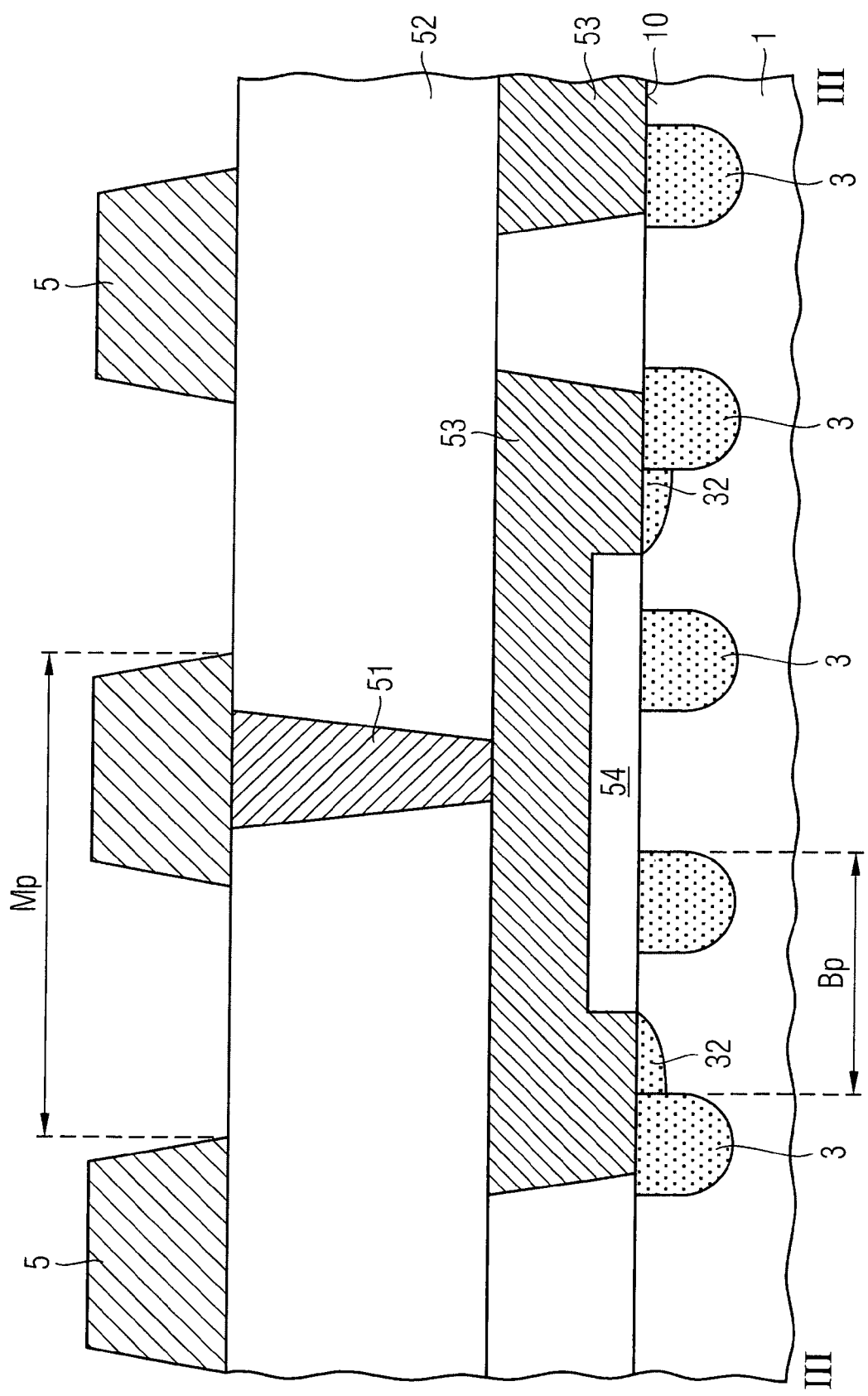
FIG. 8 shows a cross-sectional view of the memory cell array according to an embodiment of the invention.

FIG. 8 shows a cross-section view of the memory cell array of FIG. 7. As can be seen, buried bitlines 3 which are formed as continuous buried bitlines 3 are formed adjacent to the surface 10 of the substrate surface 1. For example, in a similar manner as in FIG. 5, the buried bitlines are implemented as $n^+$-doped portions. In addition, a bitline interconnect 53 is disposed so as to connect two different buried bitlines 3 with one support line 5 via a bitline contact 51. For example, two buried bitlines 3 are disposed between two buried bitlines 3 which are connected by this bitline interconnect 53. As can further be seen, each of the supporting lines 5 is disposed at the same height, the height being measured from the substrate surface 10. Nevertheless, the supporting lines 5 can as well be disposed at different heights.

In order to avoid an electrical contact between the bitline interconnect 53 and the bitlines 3 which are not to be connected via this bitline interconnect, an insulating portion 54 is provided so as to insulate the bitlines 3 which directly lie beneath the bitline interconnect 53. Adjacent bitline contacts 51 are insulated from each other by the dielectric material 52. In addition, a doped portion 32 is provided at the interface of the bitline interconnect 53 and the substrate surface 10 so as to avoid an unwanted short-circuit between the substrate and the bitline interconnect 53. As can be seen from FIG. 8, the pitch Mp between supporting bitlines 5 is larger than the distance Bp between buried bitlines. In particular, the pitch Mp may be larger than 1.5×Bp and even Mp may be equal to or larger than 2×Bp.

Figure 9A:
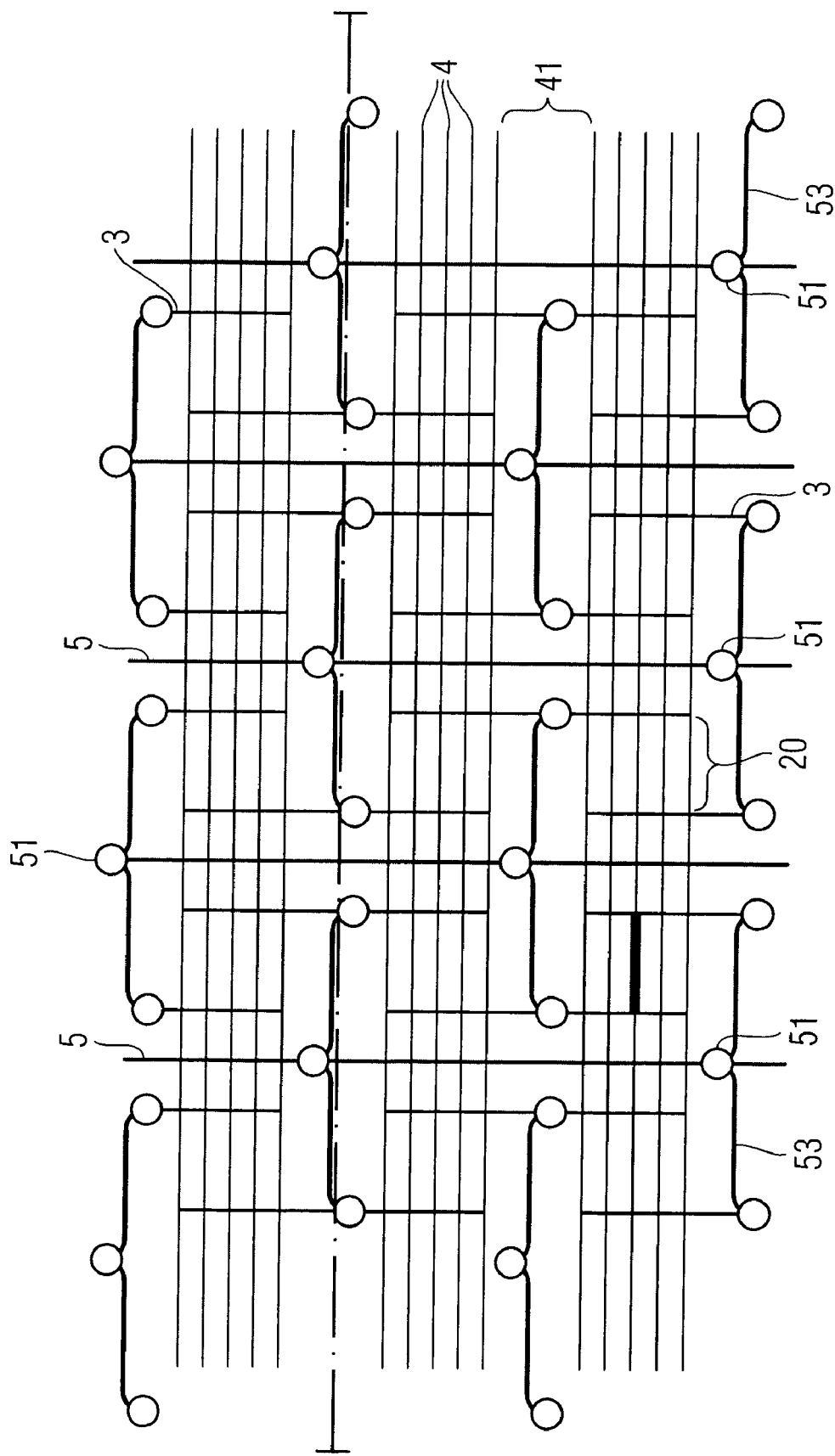
FIG. 9A shows a plan view of the memory cell array according to an embodiment of the invention.

FIG. 9A shows another embodiment of the present invention, where the buried bitlines 3 are implemented as segmented buried bitlines comprising bitline interruption portions 31. For example, the bitline interruption portions 31 may be provided in the wordline removal portion 41. FIG. 9B shows a cross-sectional view of this embodiment. As can be seen, the bitline interconnect 53 is provided above the bitline interruption portions 31 so as to avoid an electrical contact between underlying bitlines and the bitline interconnect 53. Adjacent bitline interconnects are insulated by a dielectric material 52. Moreover the dielectric material 52 is as well disposed between adjacent bitline contacts 51.

In the following, an exemplary method of forming a memory cell array according to the present invention will be described. For manufacturing the memory cell array first, a silicon substrate, which is preferably p-doped, is provided. In a first step, a storage layer stack including a first $SiO_2$ layer having a thickness of 1.5 to 10 nm, a $Si_3N_4$ layer having a thickness of 2 to 15 nm followed by a second $SiO_2$ layer having a thickness of 5 to 15 nm is deposited. Thereafter, the storage layer stack is patterned so as to form lines. The lines are covered with a protective layer and spacers adjacent to the sidewalls of the lines of the storage layer stack are formed. In the next step, first and second source/drain regions are defined by performing an ion implantation step. In particular, a photoresist material is deposited and patterned so as to expose those substrate portions which are to be implanted.

Accordingly, for manufacturing the memory cell array as shown in FIGS. 5 and 8, where the bitlines are continuous buried bitlines, a mask having a lines/spaces pattern is used so that a resulting photoresist pattern also has a lines/spaces pattern. An ion implantation step is performed using an n-dopant so as to define the first and second source/drain regions 23, 24 or buried bitlines 3, respectively. In particular, the n-dopants are implanted into the exposed substrate portions, i.e. the spaces between adjacent lines of the photoresist material.

For providing buried bitlines 3 which are, for example, shown in FIGS. 6 and 9, a different mask is used for patterning the photoresist layer. For example, a photo mask having a pattern so as to form a photoresist pattern comprising segments of spaces or elongated holes is used. For example, the interruption portions 31 are defined in a substrate portion in which the wordline removal portion will be defined in a later process step.

In the next step, a bitline oxide is provided by performing a silicon dioxide deposition step, followed by a step of depositing a wordline layer stack. For example, the wordline layer stack may include a tungsten layer having a thickness of approximately 60 nm, followed by a silicon dioxide layer having a thickness of approximately 120 nm. For example, the silicon dioxide layer may be formed by a chemical vapour deposition method, using TEOS (tetraethylorthosilicate) as a starting material.

In the next step, the wordline layer stack is patterned using a mask having a lines/spaces pattern so as to form single wordlines 2. Thereafter, selected once of the wordlines are removed so as to provide the wordline removal portion 41. Alternatively, the wordline layer stack may be patterned in such a manner that the selected wordlines are removed. Thereafter, the wordline removal portion 41 is filled with a suitable dielectric material in the next step and bitline contacts 51 are defined. Thus, an electrical contact between the buried bitlines and the supporting bitlines which are to be formed is achieved. To this end, for example, a photoresist layer may be patterned using a mask having a hole pattern so as to open holes extending to selected ones of the buried bitlines 3. After defining openings in the photoresist material, the openings are etched in the dielectric material 52 and filled with a suitable conductive material so as to provide the bitline contacts 51. The memory cell array is completed by providing a metal layer which is patterned so as to form single supporting bitlines. Thereafter, the usual steps for completing the memory cell array are performed. As is clearly to be understood, the steps of filling the openings with a conductive material so as to provide the bitline contacts and the step of depositing a layer of a conductive material for forming the metal bitlines may be accomplished by one single step.

According to a further embodiment, for obtaining the memory cell array as shown in FIG. 6, after removing the selected wordlines, the dielectric material 52 is deposited so as to fill the wordline removal portions. Thereafter, the doped portions 32 and the bitline contacts 51 are provided in a substrate surface portion 10 which is adjacent to the buried bitlines 3. For example, a photoresist mask can be provided including openings which are positioned so as to be adjacent to the buried bitlines. Thereafter, an ion implantation step is performed so as to provide a shallow doped portion. After removing the photoresist material, the openings are filled with a conductive material.

The memory cell array is completed by providing a metal layer which is patterned so as to form single supporting bitlines. Thereafter, the usual steps for completing the memory cell array are performed. As is clearly to be understood, the steps of filling the openings with a conductive material so as to provide the bitline contacts and the step of depositing a layer of a conductive material for forming the metal bitlines may be accomplished by one single step.

According to still another embodiment of the present invention, for obtaining the memory cell array as shown in FIG. 8, segments of the buried bitlines are first covered with a suitable insulating material. For example, an insulating layer may be deposited in the wordline removal region 41, followed by a patterning step so that predetermined portions of the buried bitlines are covered with the insulating portion 54. Thereafter, the bitline interconnects 53 are provided, for example, by depositing a conductive material and patterning the layer so as to form the bitline interconnects 53. For example, additionally a doped portion 32 may be provided by performing an ion implantation step before the step of forming the bitline interconnect 53. Thereafter, a dielectric material 52 is deposited and, thereafter, openings are formed in the dielectric material 52, so as to define the bitline contacts 51. The memory cell array is completed in a conventional manner by providing the supporting bitlines 5 and the other components of the memory cell array.

According to another embodiment of the invention, for obtaining the memory cell array as is shown in FIG. 9, the bitline interconnect 53 is provided above the bitline removal portion. In a first step, an insulating portion is provided so as to insulate the bitline interconnect 53 from the substrate 1. For example, isolation trenches 37 are etched between adjacent buried bitlines 3 which are to be connected by the bitline interconnect 53. An insulating material is filled into the isolation trenches and, thereafter, the bitline interconnect 53 is formed in a generally known manner. For example, a suitable conductive layer may be deposited and patterned so as to provide the bitline interconnects 53. Thereafter, a dielectric material is deposited and openings are formed in the dielectric material 52 so as to define the bitline contacts 51. Thereafter, the memory cell array is completed in a conventional manner. In particular, the supporting bitlines 5 are provided in the manner as has been described above.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A method of forming a memory cell array comprising:
   providing a semiconductor substrate including a surface;
   providing a plurality of first conductive lines extending in a first direction, wherein the first conductive lines have a pitch Bp that is measured as a distance between center positions of two adjacent first conductive lines;
   providing a plurality of second conductive lines;

providing a plurality of memory cells, wherein each of the memory cells is at least partially formed in the semiconductor substrate and is accessible by addressing at least a corresponding one of the first conductive lines and at least a corresponding one of the second conductive lines;

providing a plurality of supporting lines above the first and second conductive lines, wherein the supporting lines have a pitch Mp that is measured as a distance between center positions of two adjacent supporting lines; and providing a plurality of supporting contacts, wherein the first conductive lines are connected with corresponding ones of the supporting lines via the supporting contacts, and Mp is larger than Bp.

2. The method of claim 1, wherein Mp≧1.5×Bp.

3. The method of claim 2, wherein Mp≧2×Bp.

4. The method of claim 1, wherein the supporting lines are formed so as to extend in the first direction.

5. The method of claim 1, wherein the supporting lines are formed so as to extend in a direction that intersects the first direction.

6. The method of claim 1, wherein the supporting lines are formed as straight lines.

7. The method of claim 1, wherein the supporting lines are formed as angled lines comprising segments of straight lines, and the segments of straight lines extend in at least two different directions.

8. The method of claim 1, wherein providing a plurality of memory cells comprises providing a transistor including a first source/drain region and a second source/drain region, forming a channel between the first and second source/drain regions, providing a gate electrode, and providing a charge storage layer that stores a charge adjacent the channel, wherein the conductivity of the channel is controlled by applying a voltage to the gate electrode.

9. The method of claim 8, wherein providing the charge storage layer comprises providing a silicon nitride layer and two silicon dioxide layers, the silicon nitride layer being sandwiched between the two silicon dioxide layers.

10. The method of claim 1, wherein two neighbouring first conductive lines are connected with two different supporting lines.

11. The method of claim 10, wherein two first conductive lines are disposed between two other first conductive lines, and the two other first conductive lines are connected with a single supporting line.

12. The method of claim 1, wherein the first conductive lines are formed as continuous conductive lines.

13. The method of claim 1, wherein the first conductive lines are formed as segments of conductive lines.

14. The method of claim 1, wherein each of the supporting contacts is formed so as to connect a plurality of first conductive lines with a single supporting line.

15. A memory cell array comprising:

a semiconductor substrate including a surface;

a plurality of first conductive lines extending in a first direction, wherein the first conductive lines have a pitch Bp that is measured as a distance between center positions of two adjacent first conductive lines;

a plurality of second conductive lines;

a plurality of memory cells, each of the memory cells being at least partially formed in the semiconductor substrate and accessible by addressing at least a corresponding one of the first conductive lines and at least a corresponding one of the second conductive lines;

a plurality of supporting lines, wherein the supporting lines have a pitch Mp that is measured as a distance between center positions of two adjacent supporting lines, and the supporting lines are disposed above the first and second conductive lines; and a plurality of supporting contacts, wherein the first conductive lines are connected with corresponding ones of the supporting lines via the supporting contacts, and Mp is larger than Bp.

16. The memory cell array of claim 15, wherein Mp≧1.5× Bp.

17. The memory cell array of claim 16, wherein Mp≧2×.

18. The memory cell array of claim 15, wherein the supporting lines extend in the first direction.

19. The memory cell array of claim 15, wherein the supporting lines extend in a direction that intersects the first direction.

20. The memory cell array of claim 15, wherein the supporting lines are straight lines.

21. The memory cell array of claim 15, wherein the supporting lines are formed as angled lines comprising segments of straight lines, and the segments of straight lines extend in at least two different directions.

22. The memory cell array of claim 15, wherein each of the memory cells comprises a transistor including a first source/drain region and a second source/drain region, a channel formed between the first and second source/drain regions, a gate electrode, and a charge storage layer that stores a charge, the charge storage layer is disposed adjacent the channel and the conductivity of the channel is controlled by applying a voltage to the gate electrode.

23. The memory cell array of claim 22, wherein the charge storage layer comprises a silicon nitride layer that is sandwiched by two silicon dioxide layers.

24. The memory cell array of claim 22, wherein two neighbouring first conductive lines are connected with two different supporting lines.

25. The memory cell array of claim 24, wherein two first conductive lines are disposed between two other first conductive lines, and the two other first conductive lines are connected with a single supporting line.

26. The memory cell array of claim 15, wherein the first conductive lines are continuous conductive lines.

27. The memory cell away of claim 15, wherein the first conductive lines are formed of segments of conductive lines.

28. The memory cell array of claim 15, wherein each of the supporting contacts connects with a plurality of first conductive lines via a single supporting line.

29. A memory cell array comprising:

a semiconductor substrate including a surface;

a plurality of first conductive lines running in a first direction, wherein the first conductive lines have a pitch Bp that is measured as a distance between center positions of two adjacent first conductive lines;

a plurality of second conductive lines;

a plurality of memory cells, wherein each of the memory cells is at least partially formed in the semiconductor substrate and is accessible by addressing at least a corresponding one of the first conductive lines and at least a corresponding one of the second conductive lines;

a plurality of supporting lines, wherein the supporting lines have a pitch Mp that is measured as a distance between center positions of two adjacent supporting lines, and the supporting lines are disposed above the first and second conductive lines; and means for connecting the first conductive lines with corresponding ones of the supporting lines;

wherein Mp is larger than Bp.

30. The memory cell array of claim 29, wherein the means for connecting the first conductive lines with corresponding ones of the supporting lines are formed such that a plurality of first conductive lines is connected with a single supporting line.

* * * * *